United States Patent
Li et al.

(10) Patent No.: US 12,401,344 B2
(45) Date of Patent: Aug. 26, 2025

(54) HYBRID FILTER ON CHIP WITH INTEGRATED PASSIVE DEVICE (IPD) AND FILM BULK ACOUSTIC RESONATOR (FBAR)

(71) Applicant: SOUTH CHINA UNIVERSITY OF TECHNOLOGY, Guangzhou (CN)

(72) Inventors: Guoqiang Li, Guangzhou (CN); Kaibin Xu, Guangzhou (CN); Zhipeng Chen, Guangzhou (CN); Han Hu, Guangzhou (CN); Yuhan Zhu, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 19/017,865

(22) Filed: Jan. 13, 2025

(65) Prior Publication Data
US 2025/0167765 A1   May 22, 2025

Related U.S. Application Data
(63) Continuation of application No. PCT/CN2023/136521, filed on Dec. 5, 2023.

(30) Foreign Application Priority Data
Nov. 17, 2023 (CN) .......................... 202311544765.7

(51) Int. Cl.
| | | |
|---|---|---|
| *H03H 9/54* | (2006.01) | |
| *H03H 3/02* | (2006.01) | |
| *H03H 9/17* | (2006.01) | |

(52) U.S. Cl.
CPC .............. *H03H 9/542* (2013.01); *H03H 3/02* (2013.01); *H03H 9/173* (2013.01)

(58) Field of Classification Search
CPC ...... H03H 9/542; H03H 9/173; H03H 9/0542; H03H 9/02118; H03H 9/131; H03H 9/171;
(Continued)

(56) References Cited

U.S. PATENT DOCUMENTS

| | | | |
|---|---|---|---|
| 10,355,659 B2* | 7/2019 | Kim | ..................... H03H 9/0523 |
| 10,615,773 B2* | 4/2020 | Vetury | ............... H03H 9/02574 |

(Continued)

FOREIGN PATENT DOCUMENTS

| | | | | |
|---|---|---|---|---|
| CN | 101447336 A | 6/2009 | | |
| CN | 108566177 A * | 9/2018 | ............... | H03H 3/02 |

(Continued)

OTHER PUBLICATIONS

Translation of CN-108566177-A (Year: 2018).*
(Continued)

*Primary Examiner* — Jeffrey T Carley
(74) *Attorney, Agent, or Firm* — Bayramoglu Law Offices LLC

(57) ABSTRACT

A method for preparing a hybrid filter on a chip with IPD and FBAR, includes: preparing a leakage isolation layer on a supporting substrate by deposition; obtaining an inductor layer on the leakage isolation layer, leaving a window at a bottom of a groove surrounding a cross section of a TGV inductor stack on a mask, and patterning an inductor metal simultaneously; forming a first insulating layer on the inductor metal, and forming lead through holes by photolithography; repeating steps and alternately to obtain a three-layer stacked TGV inductor; depositing a second insulating layer on the TGV inductor; depositing two capacitor layers on the second insulating layer, and depositing a third insulating layer between the two capacitor layers to form an MIM capacitor; and preparing a BAW resonator on the MIM
(Continued)

capacitor, and connecting the TGV inductor, the MIM capacitor and the BAW resonator through the lead through holes.

18 Claims, 9 Drawing Sheets

(58) Field of Classification Search
CPC ............... H03H 3/02; H03H 2003/021; H03H 2003/023
See application file for complete search history.

(56) References Cited

U.S. PATENT DOCUMENTS

| | | | |
|---|---|---|---|
| 2018/0278236 | A1 | 9/2018 | Hurwitz |
| 2018/0309422 | A1* | 10/2018 | Shealy ................. H10N 30/877 |
| 2018/0309425 | A1* | 10/2018 | Shealy ................... H03H 9/542 |
| 2018/0367113 | A1* | 12/2018 | Shealy ................... H03H 9/547 |
| 2019/0068164 | A1* | 2/2019 | Houlden ................. H03H 3/02 |
| 2019/0132942 | A1* | 5/2019 | Yun ....................... H05K 1/0233 |
| 2020/0076405 | A1* | 3/2020 | Liu ...................... H03H 9/0523 |

FOREIGN PATENT DOCUMENTS

| | | | | |
|---|---|---|---|---|
| CN | 109309483 | A | | 2/2019 |
| CN | 111010137 | A | | 4/2020 |
| CN | 111130483 | A * | 5/2020 | ............ H03H 9/105 |
| CN | 111446943 | A | | 7/2020 |
| CN | 113410221 | A | | 9/2021 |
| CN | 114531126 | A | | 5/2022 |
| CN | 115412057 | A | | 11/2022 |
| CN | 115694412 | A | | 2/2023 |
| CN | 116760385 | A | | 9/2023 |
| TW | 202324918 | A | | 6/2023 |
| WO | WO-2020227729 | A1 * | 11/2020 | ............ H03H 9/568 |

OTHER PUBLICATIONS

Translation of CN-111130483-A (Year: 2020).*
Hou Yunghong, et al., A review: aluminum nitride MEMS contour-mode resonator, Journal of Semiconductors, 2016, pp. 1-9, vol. 37 No. 10.
Li Rui, et al., Research and Process of RF MEMS Variable Capacitors, Chinese Journal of Electron Devices, 2004, pp. 366-371,276, vol. 27 No. 2.

* cited by examiner

HYBRID FILTER ON CHIP WITH INTEGRATED PASSIVE DEVICE (IPD) AND FILM BULK ACOUSTIC RESONATOR (FBAR)

CROSS REFERENCE TO THE RELATED APPLICATIONS

This application is the continuation application of International Application No. PCT/CN2023/136521, filed on Dec. 6, 2023, which is based upon and claims priority to Chinese Patent Application No. 202311544765.7, filed on Nov. 17, 2023, the entire contents of which are incorporated herein by reference.

TECHNICAL FIELD

The present invention relates to the field of third-generation semiconductor technology and RF front-end device, and specifically to a hybrid filter on a chip with integrated passive device (IPD) and film bulk acoustic resonator (FBAR).

BACKGROUND

RF front-end chip is important strategic devices in the semiconductor industry chain, and are the core components of smart communication products such as cell phones. According to the forecast of China Industry Information Network (CIIN), the application volume of filters will further increase by the 5G era. Filters have surpassed PAs to become the most important component of the entire RF front-end module market. High-frequency broadband RF filters are also strategically important in the field of military communications, and can be widely used in such military applications as satellite communications, phased array radar, guided artillery shells, and other military applications.

According to the International Radio Regulations issued by the International Telecommunication Union (ITU), most of the frequency resources in the lower frequency band (0.6-2 GHZ) have already been occupied by 1-4G technologies. In order to increase the transmission rate while minimizing the overlap with the developed frequency bands, the 5G frequency band has been extended to the sub-6G (0.4-6 GHZ) and millimeter-wave (26.5-300 GHz) bands, and the 5G frequency band is different from the 1T2R antenna modulation technique used under the 4G band. Unlike the 1T2R antenna modulation technique used in the 4G band, 5G technology employs MIMO modulation, which exponentially increases the number of communication paths by extending them with multiple antennas at both the transmitter and receiver ends. RF filters have gained rapid development in the 5G era, for example, in the 4G era, iphone8 supports a total of about 20 frequency bands including 1G/2G/3G/4G, and at least two filters are required in the transceiver system of each band, while the iphone12 5G version adds support for 17 sub-6G bands and 3 millimeter wave bands, and the number of filters in a single device grows by more than 40.

In recent years, the FBAR is the only RF front-end filter that can be integrated because of its advantages of high frequency, miniaturization, high performance, low power consumption, high power capacity. The FBAR filter fabrication process is compatible with the CMOS process, and it can be integrated, which is conducive to the reduction of the device power consumption and the reduction of the device size. Therefore, FBAR filters will become the core components of future 5G high-frequency communication. The operating frequency range of FBAR filters using micromachining technology (MEMS) can be from several hundred MHz to tens of GHz, which completely covers the requirements of the wireless communication frequency band. Traditional dielectric filters are too large, and the insertion loss of SAW filters is large compared to FBAR filters, and they cannot meet the demand of high frequency (>3 GHZ), so FBAR filters are the optimal solution for the high-frequency band above 3 GHz.

Currently, AlN thin film is used as the piezoelectric materials for FBAR, which is due to the fact that AlN thin film have high resistivity, high thermal conductivity, high stability and high acoustic wave transmission rate compared with ZnO and PZT. However, the low piezoelectric coefficient limits the performance of AlN thin film strain capacity in high frequency. To solve this bottleneck of AlN thin film, doping is a current approach to enhance piezoelectric property.

Whereas, the critical shortcomings in the doping technique still need to be overcome. Due to the increased lattice scattering within the AlScN crystalline caused by Sc doping, the additional introduction of lattice stresses, and the alteration of the AlN electronic properties. Which leads to the acoustic wave propagation loss is increase within the AlScN crystalline, and the quality factor (Q-value) is decrease ultimately. In addition, the insertion loss of the filter is increase, and it degrades the signal quality for communication.

LC filter can realize a large bandwidth, the roll-off is poor, which limits their application in today's crowded and scarce spectrum resources. Increasing the number of steps is an effective way to increase the roll-off of an LC filter, utilizing more capacitance and inductance to increase the signal screening capability. However, this will result in an exponential increase in the size of the filter. The more capacitance and inductance, the more signal loss will be introduced, which will lower the Q-value of the filter.

SUMMARY

In order to overcome the shortcomings of the prior art, it is an object of the present invention to provide a hybrid filter on a chip with IPD and FBAR. The present application seeks to solve the problems of difficulty in realizing a large bandwidth of traditional bulk acoustic wave (BAW) filter, poor roll-off and poor signal screening ability of LC filter, and difficulty in reducing the filter size caused by multiple capacitors and inductors in the high order LC circuit. A hybrid filter on a chip with IPD and FBAR and it's fabrication is provided to solve the problems existing in related technologies. The purpose of the present invention is achieved by one of the following technical solutions.

The present invention provides a hybrid filter on a chip with IPD and FBAR.

(1) Preparing a leakage isolation layer on a supporting substrate by deposition.

(2) Obtaining an inductor layer by physical vapor deposition on the leakage isolation layer, leaving a window at the bottom of the groove surrounding the cross section of the through glass via (TGV) inductor stack on the mask, and patterning the inductor metal simultaneously.

(3) Forming an insulating layer on the inductor layer by chemical vapor deposition, and forming lead through holes by photolithography.

(4) Obtained a through silicon via (TSV) inductance by preparing inductance layer and isolation layer alternately.

(5) Depositing another insulating layer on the TSV inductor by chemical vapor deposition to serve as a partition between the capacitor layer and the TSV inductor.

(6) Depositing two capacitor layers and a insulating layer by physical vapor deposition, and the insulating layer is between the two capacitor layers to form a metal insulator metal (MIM) capacitor.

(7) Further, prepared a BAW resonator on the MIM capacitor, and the TSV inductor, the MIM capacitor and the BAW resonator are connected through lead through hole to obtain a hybrid filter on a chip with IPD and FBAR.

The BAW resonator includes a bottom electrode, a piezoelectric layer, a top electrode and an anti-oxidation layer, and an air gap is formed between the bottom electrode and the MIM capacitor. The piezoelectric layer is between the bottom electrode and the top electrode.

Further, the material of the bottom electrode and the top electrode is one or more of aluminum, molybdenum, tungsten, platinum, titanium, and gold.

Further, the material of the piezoelectric layer is single-crystalline aluminum nitride, or polycrystalline aluminum nitride, or zinc oxide, or lead zirconate titanate, or barium strontium titanate (BST), or $LiNbO_3$ Further, the material of the anti-oxidation layer is aluminum nitride.

Further, the supporting substrate is made of silicon, sapphire, $LiGaO_2$ or metal.

Further, the material of the leakage isolation layer is gallium arsenide.

Further, the insulating layer is made of silicon dioxide.

Further, the material of the lead through hole is gold, copper, or molybdenum.

Further, the material of the inductor layer is copper.

Further, the material of the capacitor layer is copper.

An embodiment of the present application provides a hybrid filter on a chip with IPD and FBAR, wherein:

A supporting substrate;

A leakage isolation layer, wherein the leakage isolation layer is disposed on the supporting substrate.

An IPD inductor structure, wherein the IPD inductor structure is disposed on the leakage isolation layer.

An IPD capacitor structure, wherein the IPD capacitor structure is disposed on the IPD inductor structure.

A BAW resonator, wherein the BAW resonator is disposed on the IPD capacitor structure.

The IPD inductor structure, the IPD capacitor structure and the BAW resonator are connected through lead through holes.

In the implementation, the IPD inductor structure includes one or more combinations of a TSV inductor, a meander line inductor, a square spiral inductor, a circular spiral inductor, and an octagonal spiral inductor.

BRIEF DESCRIPTION OF THE DRAWINGS

In Drawings, unless otherwise specified, identical Drawing mark throughout multiple Drawings indicate identical or similar parts or elements. These Drawings are not necessarily drawn to scale. These Drawings depict only some Examples disclosed under this application and should not be regarded as limiting the scope of this application.

DETAILED DESCRIPTION OF THE EMBODIMENTS

In order to clearly expound the purpose, technical solutions and advantages of the embodiments of the present invention clearer, the technical solutions of the embodiments of the present invention will be described clearly and completely in combination with the accompanying drawings. The embodiments described below with reference to the drawings are exemplary. They are only used to explain the present disclosure and should not be construed as a limitation of the present disclosure.

The present invention provides, by way of example, a hybrid filter on a chip with IPD and FBAR. The present application seeks to solve the problems of difficulty in realizing a large bandwidth of a unified BAW, poor roll-off and poor signal screening ability of LC circuits, and difficulty in reducing the size of the filter due to the need for multiple capacitors and inductors in the higher-order LC circuits, and to provide a hybrid filter on a chip with IPD and FBAR.

Embodiments 1

Figure 8:

This embodiment provides a hybrid filter on a chip with IPD and FBAR, as shown in FIG. 8, including a supporting substrate 1, a leakage isolation layer 2, an inductance layer 3, an insulating layer 4, an inductance layer 5, an insulating layer 6, an inductance layer 7, an insulating layer 8, a capacitance layer 9, an insulating layer 10, a capacitance layer 11, a sacrificial layer 12, a bottom electrode 13, piezoelectric layer 14, top electrode 15, antioxidant layer 16, metal conductive pad 17, access pin 18, ground pin 19, output pin 20, IPD TGV inductance 21, IPD MIM capacitance 22, leaded through-hole 23, air gap 24. Inductance layer 3, insulating layer 4, inductance layer 5, insulating layer 6, and inductance layer 7 together constitute TGV inductance 21; capacitance layer 9, insulating layer 10, capacitance layer 11 together constitute IPD MIM capacitor 22; bottom electrode 13, piezoelectric layer 14, top electrode 15, antioxidant layer 16, air gap 24 together constitute BAW resonator. IPD TGV inductor 21, IPD MIM capacitor 22 and BAW resonator are connected through lead through hole 23 to realize the construction of a hybrid filter on a chip with IPD and FBAR.

Embodiment 1 provides a hybrid filter on a chip with IPD and FBAR, including:

(1) A leakage isolation layer is prepared by deposition on the supporting substrate to improve the Q of the IPD capacitive inductance of the collector element.

(2) An inductor layer is obtained by physical vapor deposition (PVD) on the leakage isolation layer prepared in step (1), leaving a window for the TGV inductor cross-section on the mask plate, while the inductor metal is patterned as required.

(3) An insulating layer (a two-dimensional film, an insulating layer needs to be deposited between different inductive layers to ensure that mutual inductance and coupling effects do not occur between inductive elements) is obtained by chemical vapour deposition (CVD) on the inductive metal prepared in step (2), and lead through-holes are obtained by photolithography.

(4) Steps (2) and (3) were repeated alternately to obtain a three-layer stacked TGV inductor (Through Glass Via, TGV).

(5) A further insulating layer is deposited by chemical vapour deposition above the TGV inductor prepared in step (4) as a partition between the capacitive layer and the TGV inductor to avoid a strong dielectric coupling effect.

(6) Two capacitive layers (two-dimensional films) are deposited by physical vapour deposition on top of the insulating layer deposited in step (5), and an insulating layer is deposited between the two capacitive layers to form an MIM capacitor.

(7) A BAW resonator is prepared on the MIM capacitor prepared in step (6), and the TGV inductor, MIM capacitor, and BAW resonator are connected through lead through holes to obtain hybrid filter on a chip with IPD and FBAR.

In one embodiment, the BAW resonator connection includes bottom electrode, piezoelectric layer, top electrode, and antioxidant layer disposed in sequence, with an air gap formed between the bottom electrode and the MIM capacitor. The bottom electrode, and the piezoelectric layer, and the top electrode form a sandwich structure.

The antioxidant layer is prepared to protect the top electrode from high temperature oxidation. Under high frequency operation, the continuous signal access will cause the overall heating of the device. If the surface of the electrode is oxidised, the efficiency of the filter will be greatly affected. The thickness allowance can be appropriately increased when preparing the antioxidant layer. In the process preparation of this application, the antioxidant layer should also function as a frequency modulation layer, and the thickness of the deposited piezoelectric film fluctuates within the allowable range, and the thickness of the piezoelectric layer is directly related to the center frequency of the filter, and the center frequency can be fine-tuned by thinning the thickness of the frequency modulation layer (antioxidant layer).

In one embodiment, the materials of the bottom and top electrodes are one or more of aluminum (Al), molybdenum (Mo), tungsten (W), platinum (Pt), titanium (Ti), and gold (Au).

In one embodiment, the material of the piezoelectric layer is monocrystalline aluminum nitride, or polycrystalline aluminum nitride, or zinc oxide, or lead zirconate titanate, or BST, or $LiNbO_3$.

In one embodiment, the material of the antioxidant layer is aluminum nitride (AlN).

In one embodiment, the material supporting the substrate is silicon, or sapphire, or $LiGaO_2$, or metal.

In one embodiment, the material of the leakage isolation layer is gallium arsenide.

In one embodiment, the material of the insulating layer is silicon dioxide ($SiO_2$).

In one embodiment, the material of the lead through-hole is gold, or copper, or molybdenum.

In one embodiment, the material of the inductor layer is copper.

In one embodiment, the material of the capacitor layer is copper.

It should be understood that in specific implementations, it is also necessary to provide input pins, output pins, and ground pins, in copper (Cu), or gold (Au), or molybdenum (Mo).

In a second aspect, embodiments of the present application provide a body acoustic wave monolithic hybrid filter with integrated passive components, including:

Supporting substrate, the leakage isolation layer, the IPD inductor structure, the IPD capacitor structure and the BAW resonator.

Said leakage isolation layer was provided on said supporting substrate;

Said IPD inductor structure was provided on said leakage isolation layer;

Said IPD capacitor structure was provided on said IPD inductor structure;

Said BAW resonator was provided on said IPD capacitor structure;

Said IPD capacitor structure, said IPD capacitor structure and said BAW resonator connection are connected via lead through holes.

In one embodiment, the IPD inductor structure includes one or more combinations of a TGV inductor, a bent wire type inductor, a square spiral inductor, a circular spiral inductor, and an octagonal spiral inductor.

IPD is a method of creating matched sense capacitor circuits, branch series inductors, branch shunt inductors, branch series capacitors, branch shunt capacitors, low-pass filter circuits, high-pass filters and band-pass filters. In the process of combining the IPD and BAW techniques: 1, IPD technology can be used to build bandpass filters that can be cascaded with BAW bandpass filters. Together, they achieve a wide bandwidth and high roll-off effect. In the process of using IPD technology to realize bandpass filters, it is not usually a single circuit, but a combination of series inductors, parallel inductors, series capacitors, and parallel capacitors. 2, The matched sense capacitance circuits referred to herein use IPD technology to implement matching circuits to reduce the reflections caused by the signal as it enters the device, thereby reducing the distortion of the RF signal.

When the IPD inductor structure is a TGV inductor, a hybrid filter on a chip with IPD and FBAR is prepared by the above-described method for preparing a hybrid filter on a chip with IPD and FBAR. In this case, the TGV inductor includes a multilayer laminated structure formed by shaping the inductor layer and the insulating layer.

In one embodiment, the IPD capacitor structure includes one or more combinations of an MIM capacitor, a Interdigital capacitor, and a VLC capacitor.

MIM capacitance, Interdigital capacitance, and VLC capacitance are different presentations in the category of IPD capacitance. In the example 1, MIM capacitors are used. And in the design of epitaxial structures, if the volume of space available for the design is too small, cross-finger capacitors with smaller capacitance values but which can be prepared in a single epitaxial layer are also chosen. The exact choice is usually determined by its capacitance value and volume, often in combination as well.

When the IPD capacitor structure is an MIM capacitor, the body acoustic wave monolithic hybrid filter of the integrated passive device is prepared by the method for monolithic hybrid filter of body acoustic wave devices for integrated passive devices described above. At this time, the MIM capacitor includes a multilayer sandwich structure formed by the capacitor layer, the insulating layer, and the capacitor layer.

It is noted that, in particular embodiments, the IPD circuit includes one or more combinations of a matched sense capacitance circuit, a branch series inductor, a branch shunt inductor, a branch series capacitor, a branch shunt capacitor, a low-pass filter circuit, a high-pass filter, and a band-pass filter.

The example 1 uses TGV inductors due to the fact that all of the inductance values needed are large, and such inductors are used due to the fact that they can be cascaded in multiple layers to obtain higher inductance values. Of course, inductors of different sizes are used due to the fact that they will be used inside the circuit. Whereas small inductance inductors using planar inductors such as circular spiral inductors or octagonal spiral inductors tend to be more space efficient, so there will be any combination mentioned in this application.

The following is the structure of a hybrid filter on a chip with IPD and FBAR when the IPD inductor structure is a TGV inductor and the IPD capacitor structure is an MIM capacitor, including a supporting substrate 1, a leakage isolation layer 2, an inductance layer 3, an insulating layer 4, an inductance layer 5, an insulating layer 6, an inductance layer 7, an insulating layer 8, a capacitance layer 9, an insulating layer 10, a capacitance layer 11, a sacrificial layer 12, a bottom electrode 13, piezoelectric layer 14, top electrode 15, antioxidant layer 16, metal conductive pad 17, access pin 18, ground pin 19, output pin 20, IPD TGV inductance 21, IPD MIM capacitance 22, leaded through-hole 23, air gap 24. Inductance layer 3, insulating layer 4, inductance layer 5, insulating layer 6, and inductance layer 7 together constitute TGV inductance 21; capacitance layer 9, insulating layer 10, capacitance layer 11 together constitute IPD MIM capacitor 22; bottom electrode 13, piezoelectric layer 14, top electrode 15, antioxidant layer 16, air gap 24 together constitute BAW resonator. IPD TGV inductor 21, IPD MIM capacitor 22 and BAW resonator are connected through lead through hole 23 to realize the construction of a body acoustic wave monolithic hybrid filter with integrated passive devices.

More specifically, the piezoelectric layer 14 is a single crystalline aluminum nitride (AlN) layer.

Preparation of supporting substrate 1 material is 4-8 inch high resistance silicon wafer.

The bottom electrode 13 and top electrode 15 material is molybdenum (Mo).

The leakage isolation layer 2 material is gallium arsenide.

The lead through-hole 23 material is gold (Au).

The insulating layer material is silicon dioxide ($SiO_2$).

The antioxidant layer (FM layer) 16 material is aluminum nitride (AlN).

Input pin 18, output pin 20, and ground pin 19 are made of gold (Au).

The inductor layers 3, 5 and 7 material is copper (Cu).

The material of capacitor layers 9 and 11 is copper (Cu).

Figure 1:
FIG. 1-FIG. 28 show the process flow diagram of the prepared sample of Example 1.

A hybrid filter on a chip with IPD and FBAR in this Example 1 is prepared by the following steps:

(1) Firstly, high resistance silicon wafers are cleaned, as shown in FIG. 1, selecting 4-inch wafer size quartz glass (silicon dioxide) washed with acetone, anhydrous ethanol, and then washed with $H_2SO_4:H_2O_2:H_2O$ (3:1:1) and $HF:H_2O$ (1:10) to remove silicon surface oxides and contamination particles, and then washed with deionized water for 10 min, and then finally shaken dry in the concentration of the HF solution is 1.5%, and then washed with deionized water for 10 min, and finally dried in HF solution concentration of 1.5%, and put into the oven for drying.

Figure 2:

(2) As shown in FIG. 2, high-quality AsGa (gallium arsenide) leakage isolation layer 2 was grown on a high-resistance silicon substrate. During the growth process, the GaAs low-temperature nucleation layer was energized with $AsH_3$ flow rate of $4.5 \times 10^{-3}$ mol/min and TMGa flow rate of $1.8 \times 10^{-5}$ mol/min at 390° C., while the GaAs high-temperature epitaxial layer and higher-temperature GaAs epitaxial layer were energized with $AsH_3$ flow rate of $2.7 \times 10$ mol/min and TMGa flow rate of $4.1 \times 10$ mol/min at 600° C./650° C. High temperature GaAs epitaxial layer and higher temperature GaAs epitaxial layer at 600° C./650° C. were energized with $AsH_3$ flow rate of $2.7 \times 10^{-3}$ mol/min, TMGa flow rate of $4.1 \times 10^{-5}$ mol/min.

Figure 3:

(3) As shown in FIG. 3, the prototype of inductor layer 3 was prepared by low-temperature CVD of $SiO_2$ on the leakage isolation layer 2 prepared in step 2. The low-temperature oxidative deposition of silane was carried out at the temperature of about 400° C. In the oxygen-containing atmosphere, the silane ($SiH_4$) thermally decomposed on the surface of the substrate and reacted with oxygen to form $SiO_2$.

Figure 4:
Figure 5:
Figure 6:
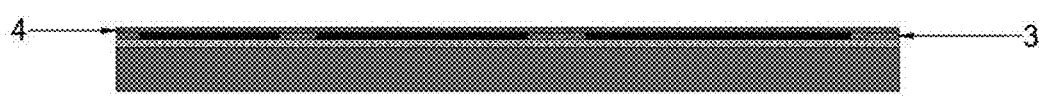

(4) As shown in FIGS. 4-5, Cu film was deposited by CVD on $SiO_2$ film prepared in step 3, adhesion promoter was applied to the surface of prepared $SiO_2$ film, spin-coated photoresist, pre-baked to remove water vapor, exposed to UV light for 5 s, and immersed in developer for 40-60s to obtain the samples with the shape of an inductor; then the wafer was loaded into a PVD carrier cavity with a cavity backpressure of 5× 10-7 Torr, and sputtered to grow Cu under AC power 4 kw conditions for sputter growth of Cu. The Cu target was pre-sputter cleaned for 10 min before starting the sputter growth. Subsequently, the Cu film was stripped for patterning and the inductor material was usually copper with a thickness of 100 nm; the metal on the photoresist was stripped to obtain the patterning inductor layer 3 by soaking in acetone for 3 min.

Figure 7:

(5) As shown in FIG. 7, the inductor layer 3 prepared in step 4 is deposited by low-temperature CVD with $SiO_2$, to prepare the prototype of the isolation layer 4, on which the through holes need to be etched subsequently. The low temperature oxidative deposition of silane is carried out at a temperature of about 400° C. Silane ($SiH_4$) is thermally decomposed on the substrate surface in an oxygen-containing atmosphere and reacts with oxygen to form $SiO_2$.

Figure 9:

(6) As shown in FIGS. 8-9, Au film was deposited by CVD on $SiO_2$ film prepared in step 5, adhesion promoter was applied to the surface of prepared $SiO_2$ film, photoresist was spin-coated, water vapor was removed by prebaking, UV exposure was performed for 5 s, and samples with the shape of the through-hole were obtained by immersing them in developer solution for 40-60 s. Then, wafers were loaded into a PVD carrier cavity with the cavity backpressure of 5× 10-7 Torr, and Au was grown by sputtering at AC power of 5.2 kw for sputtering growth of Au. Subsequently, the Au film was stripped for patterning, and the through-hole material was usually copper with the thickness of 150 nm; the metal on the photoresist was stripped to obtain the patterning isolation layer by soaking in acetone for 5 min. The Au film was stripped for patterning and the through-hole material was usually copper with the thickness of 150 nm.

(7) As shown in FIG. 9, the complete IPD TGV inductor 21 and IPD MIM capacitor 22 can be obtained by repeating steps (3)-(6) three times by replacing different mask plates according to the same method and process parameters.

Figure 10:
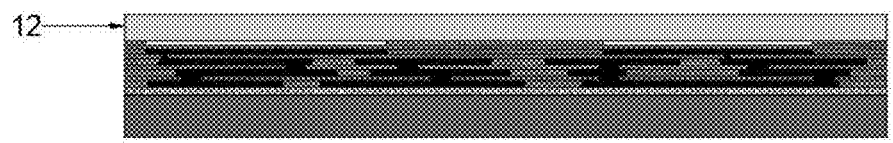

(8) As shown in FIG. 10, PSG (phosphor quartz glass) was deposited by low-temperature CVD as a sacrificial layer 12 with a thickness of 600 nm on the capacitive layer 11 prepared in step 7.

Figure 11:
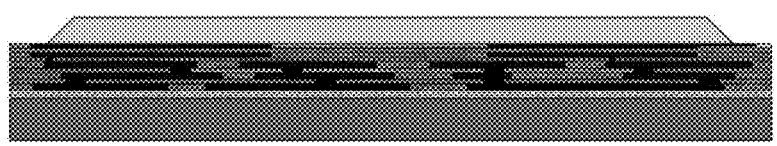

(9) As shown in FIG. 11, the basic shape of the support structure was obtained by etching on the sacrificial layer 12 prepared in step 8, and the specific process was as follows:

a commonly used etching equipment, inductively coupled plasma (ICP) etcher, was selected to carry out the dry etching process of AlN thin films, and the parameters of the equipment were set as follows: 1500 W ICP coil power, 10° C. temperature in the etching chamber, 5 mTorr chamber pressure, and −400 V substrate bias voltage. and −400 V substrate bias. The dry etching was carried out at a volume flow rate of 70, 50, and 30 cm$^3$/min for $Cl_2$, $BCl_3$, and Ar, respectively, and the etching depth was through the sacrificial layer 12 until the underlying capacitive layer 11 was revealed.

Figure 12:
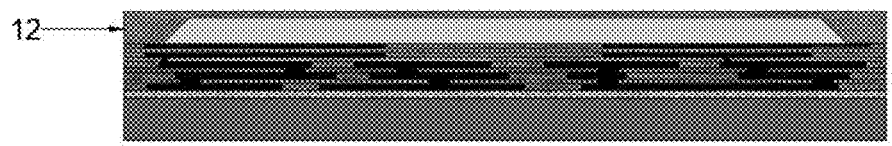

(10) As shown in FIG. 12, a support structure SiN was deposited on the $SiO_2$ sacrificial layer 12 etched in step 9 with a deposition thickness of 680 nm.

Figure 13:
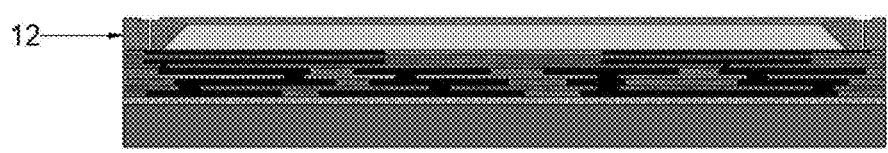
Figure 14:
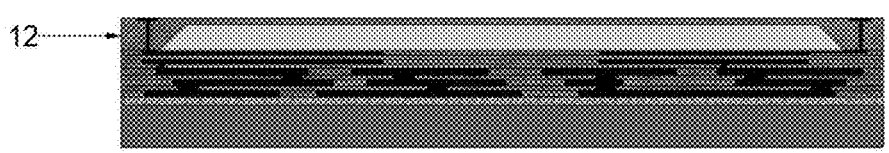

(11) As shown in FIGS. 13-14, a tackifier was applied to the surface of the sacrificial layer 12 deposited in step 10, the photoresist was spin-coated, the water vapor was removed by prebaking, UV exposure was performed for 5 s, and the sample with the shape of the through-hole was obtained by immersing it in a developing solution for 40-60 s. Then, the wafers were loaded into a PVD carrier cavity with the cavity backpressure of 5× 10-7 Torr, and the Au was grown by sputtering at an AC power of 5.2 kw. Subsequently, the Au film was stripped for patterning, and the through-hole material was usually copper with a thickness of 150 nm; the metal on the photoresist was stripped to obtain the patterning lead through-hole by soaking in acetone for 5 min 23.

Figure 15:
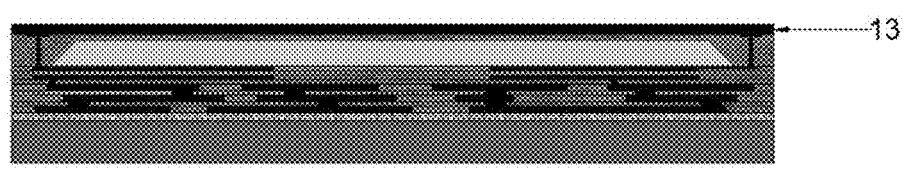
Figure 16:
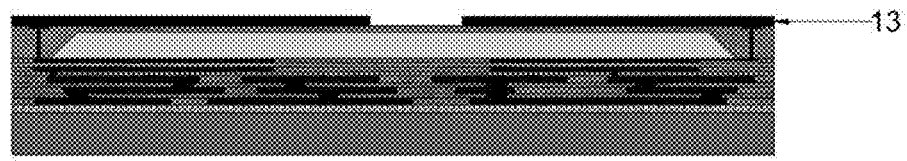
Figure 17:
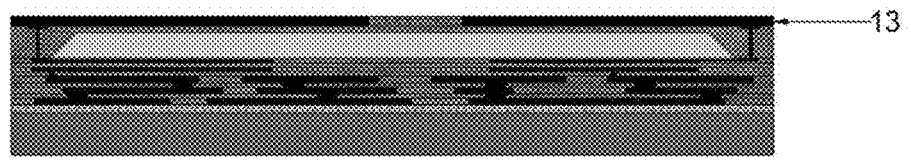

(12) As shown in FIGS. 15-17, a layer of molybdenum metal was sputter deposited on the surface of the substrate after lithography as a bottom electrode 13 using a DC vacuum magnetron sputtering coater on the basis of the sacrificial layer 12 prepared in step 11, the top electrode 15 and the bottom electrode 13 materials are usually molybdenum with the thickness of 100 nm; the graphical bottom electrode 13 was obtained by immersing the substrate in acetone for 3 min and peeling off the metal on the photoresist.

Figure 18:
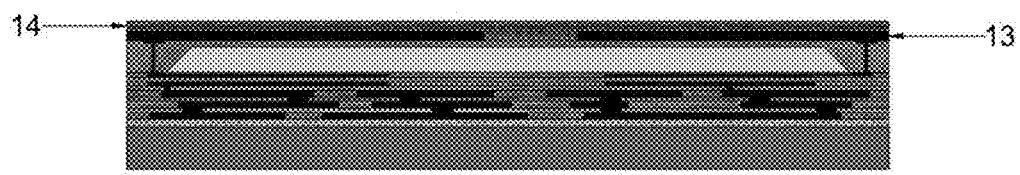

(13) As shown in FIG. 18, a high-quality AlN piezoelectric layer 14 was prepared by magnetron sputtering on the basis of the bottom electrode 13 with piezoelectric stack cross-section surrounding the bottom of the trench prepared in step 12, and the specific process was as follows: adjusting the parameters of the equipment and the target material, in the PVD carrier cavity, the cavity backpressure of 5×10$^{-7}$ Torr, and sputtering growth of AlN with an AC power of 6 kw, an Ar throughput speed of 10 sccm, and a $N_2$ throughput speed of 45 sccm. The AlN was sputtered at a thickness of 200 nm with AC power of 6 kw, Ar feed rate of 10 sccm, and $N_2$ flow rate of 45 sccm. The sputtering gases were 99.9999% high-purity N and Ar, and the sputtered Al target pure was 99.999%, and the Al target was pre-sputter-cleaned for 10 min before sputtering was initiated.

Figure 19:
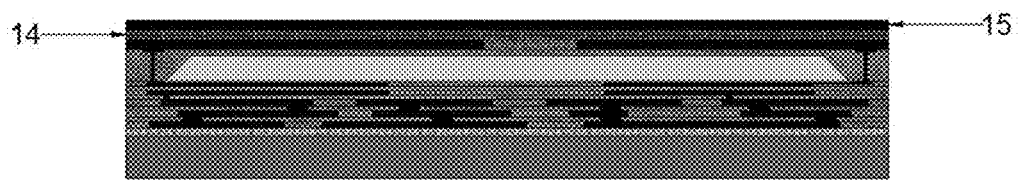
Figure 20:
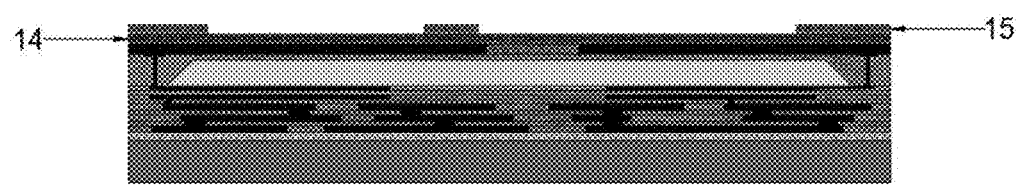
Figure 21:

(14) As shown in FIGS. 19-21, the top electrode 15 is prepared on the surface of the piezoelectric layer 14 where the etching step is completed in step 13, and at the same time is patterned by photolithography. The top electrode 15 was obtained on the piezoelectric layer 14 by photolithography, magnetron sputtering, and stripping in the following process: applying a tackifier to the surface of the piezoelectric layer 14, spinning a photoresist, exposing to UV light for 5 s, and developing to obtain a sample with the top electrode 15. Then, using a DC vacuum magnetron sputtering coater, a layer of molybdenum metal is sputter deposited on the surface of the substrate after lithography as the top electrode 15, the top electrode 15 is usually molybdenum, with a thickness of 100 nm; the top electrode 15 is patterning is obtained by immersing it in acetone for 3 min, and the metal on the photoresist is peeled off.

Figure 22:
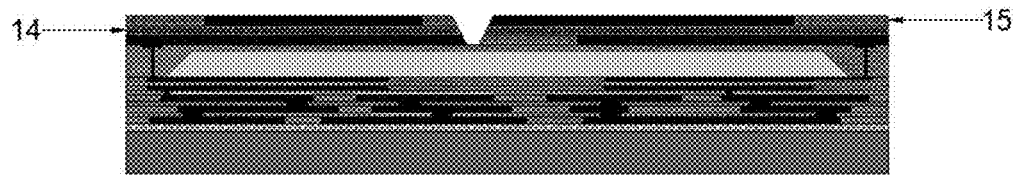

(15) As shown in FIG. 22, deep hole etching was performed at the top electrode 15 prepared in step 14 to open up the top and bottom electrodes of the two resonators to facilitate cascading of the two resonators. The specific process is as follows: a commonly used etching equipment, inductively coupled plasma (ICP) etcher, was selected for the dry etching process of AlN thin films, with the following equipment parameters: ICP coil power of 1500 W, etching chamber temperature of 10° C., cavity pressure of 5 mTorr, and substrate bias of −400 V. The top and bottom electrodes were etched at $Cl_2$, $BCl_3$ and Ar. Dry etching was carried out under $Cl_2$, $BCl_3$ and Ar volume flow rates of 70, 50 and 30 cm$^3$/min, and the etching depth was through the AlN piezoelectric layer 14 until the bottom electrode 13 was revealed.

Figure 23:
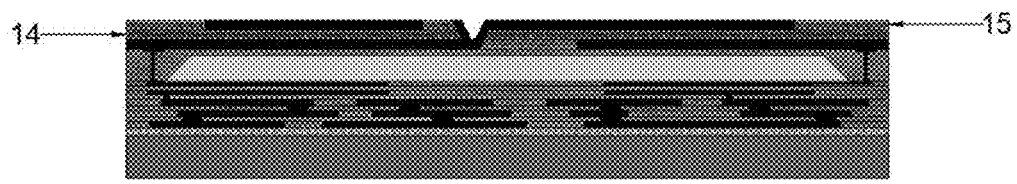

(16) As shown in FIG. 23, a Mo layer is deposited on the surface of the deep hole etched out in step 15, connecting the top and bottom electrodes of the two resonators, thus making the two resonators connected by series.

Figure 24:
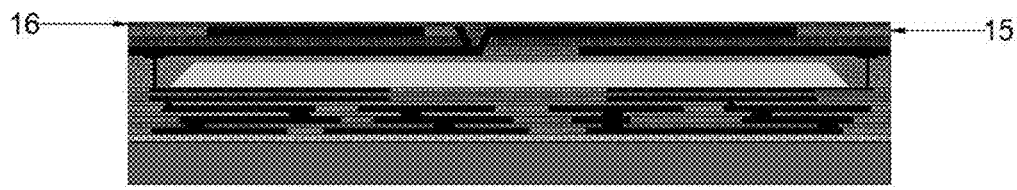

(17) As shown in FIG. 24, on the top electrode 15 prepared in step 16, a thinner AlN film is deposited by PVD as an antioxidant layer 16, usually 70 nm, which serves to protect the Mo electrode, i.e., the top electrode 15, from oxidization, with 20 nm being the thickening margin, reserved for subsequent FM use.

Figure 25:
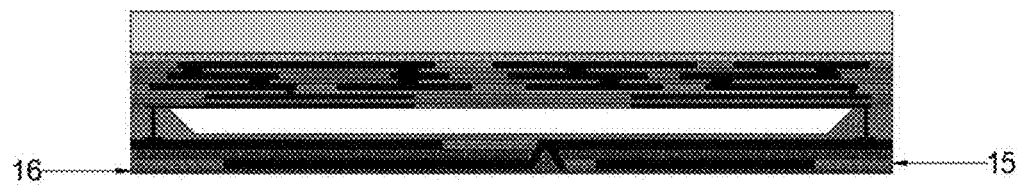

(18) As shown in FIG. 25, HF is utilized to react with the PSG (phosphor quartz glass) sacrificial layer, a step commonly referred to as releasing the sacrificial layer. When the reaction is complete, the area originally filled with PSG will become a cavity.

Figure 26:
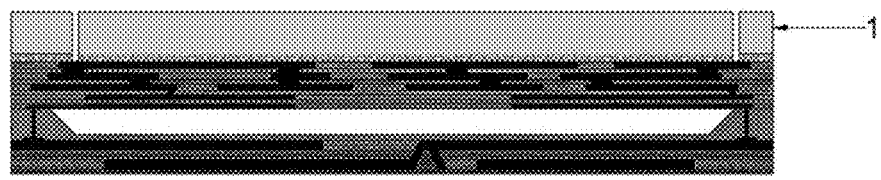

(19) The wafer is inverted so that the substrate is facing up, as shown in FIG. 26, and the etching of the conductive vias will follow.

Figure 27:
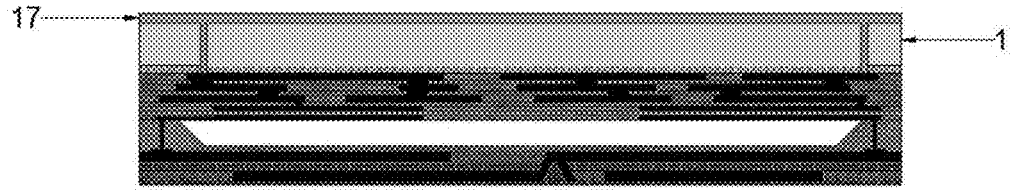
Figure 28:
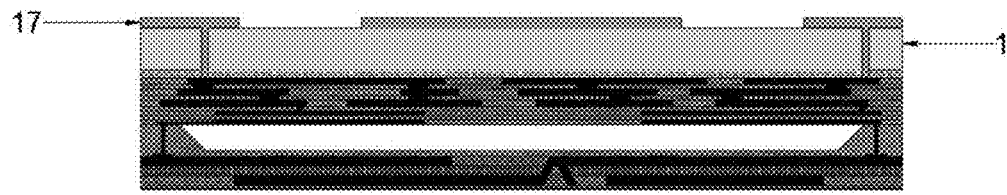

(20) As shown in FIG. 27-28, the shape of a metal conductive pad 17 is obtained by ICP etching through the substrate 1 until the leakage isolation layer 2 is revealed, and the shape of a metal conductive pad 17 is obtained by photolithographic stripping on the reverse side of the substrate 1, and a 100 nm copper is deposited by utilizing PVD to obtain the access pins 18, the ground pins 19, and the output pins 20.

Figure 29:
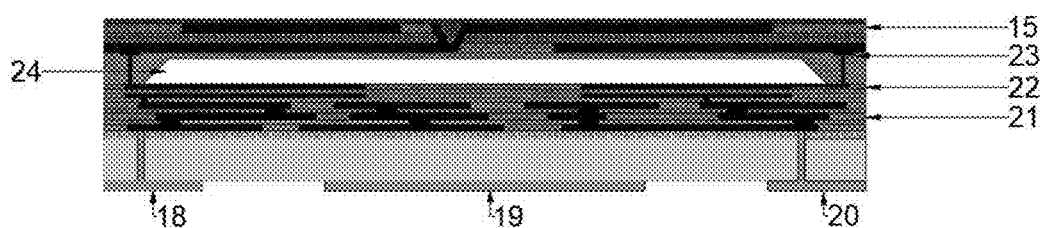
FIG. 29-FIG. 31 show the structural diagram of the prepared sample of Example 1.
Figure 30:
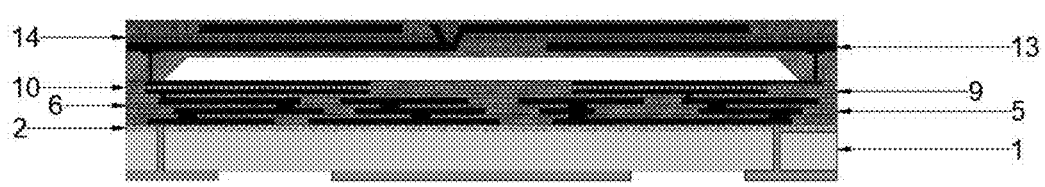
Figure 31:
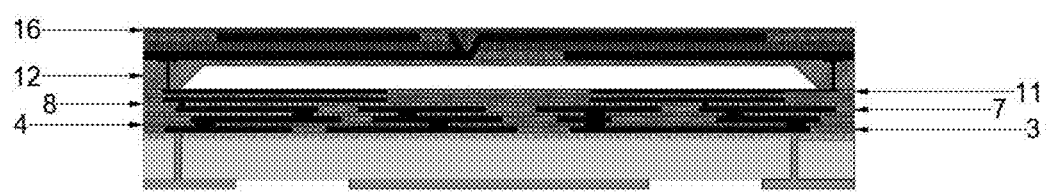

(21) As in FIG. 29-31, the wafer is flipped to obtain a body acoustic wave (BAW) monolithic hybrid filter with integrated (IPD).

Figure 34:
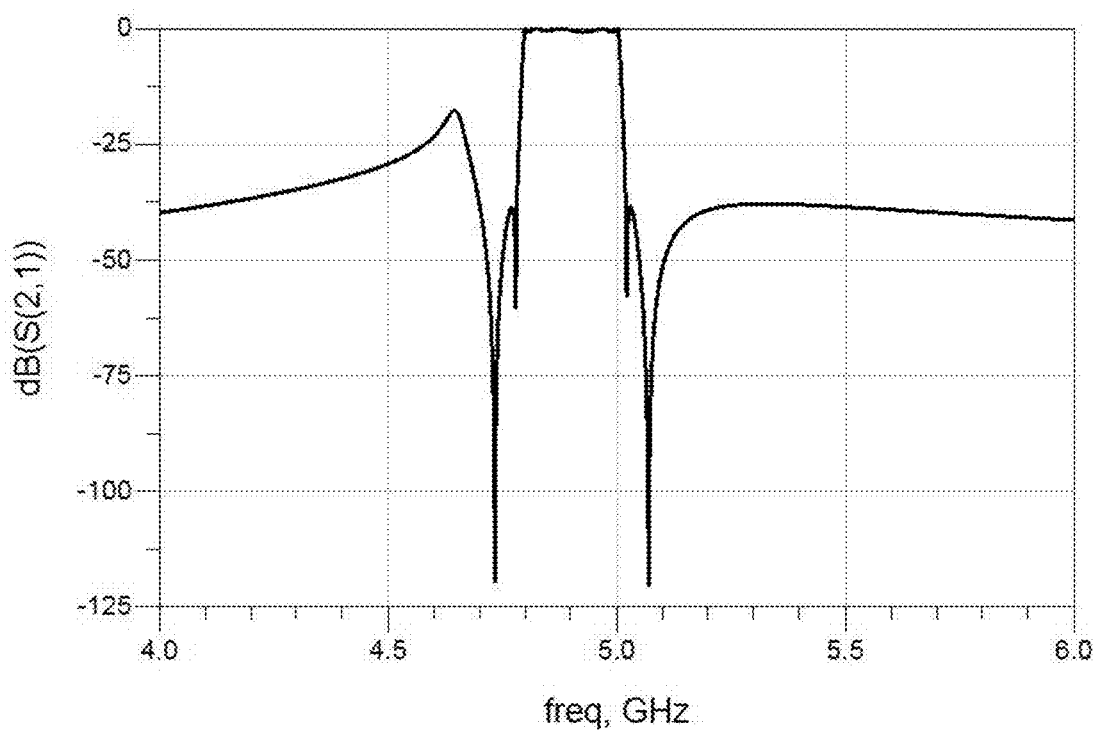
FIG. 34 is a schematic diagram of parameter curve S21 of Example 1 of this application.

Performance Analysis:

Example 1 is a hybrid filter structure with two BAW resonators, six IPD inductors, and two capacitors, and the parametric curve S21 is shown in FIG. 34. A body acoustic wave (BAW) monolithic hybrid filter with integrated IPDs, obtained by the above steps, exhibits high roll-off coefficients out of passband, and 120 dB roll-off zero after the second roll-off, which is attributable to the excellent roll-off coefficient of the BAW resonator.

Figure 33:
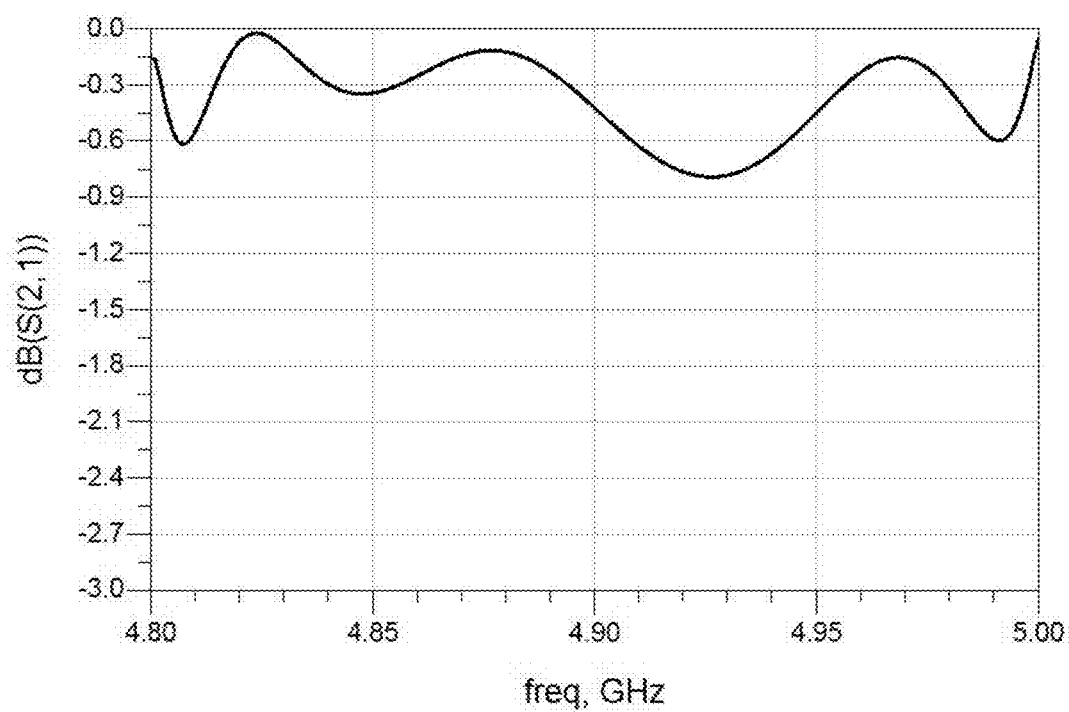
FIG. 33 is a schematic diagram of the passband ripple of Example 1 of this application.

As shown in FIG. 33, the passband ripple performance of the example 1 of the present invention. It can be seen from the figure that in the passband, the maximum insertion loss is less than 0.9 dB (the industry standard is that when the insertion loss is less than 3 dB, the designed filter can be used, and when it is less than 1.2 dB, it is the industry leading level). It can be seen that the insertion loss control of the present application is at a very excellent level. Lower insertion loss can ensure higher fidelity of the RF signal during transmission.

Figure 32:
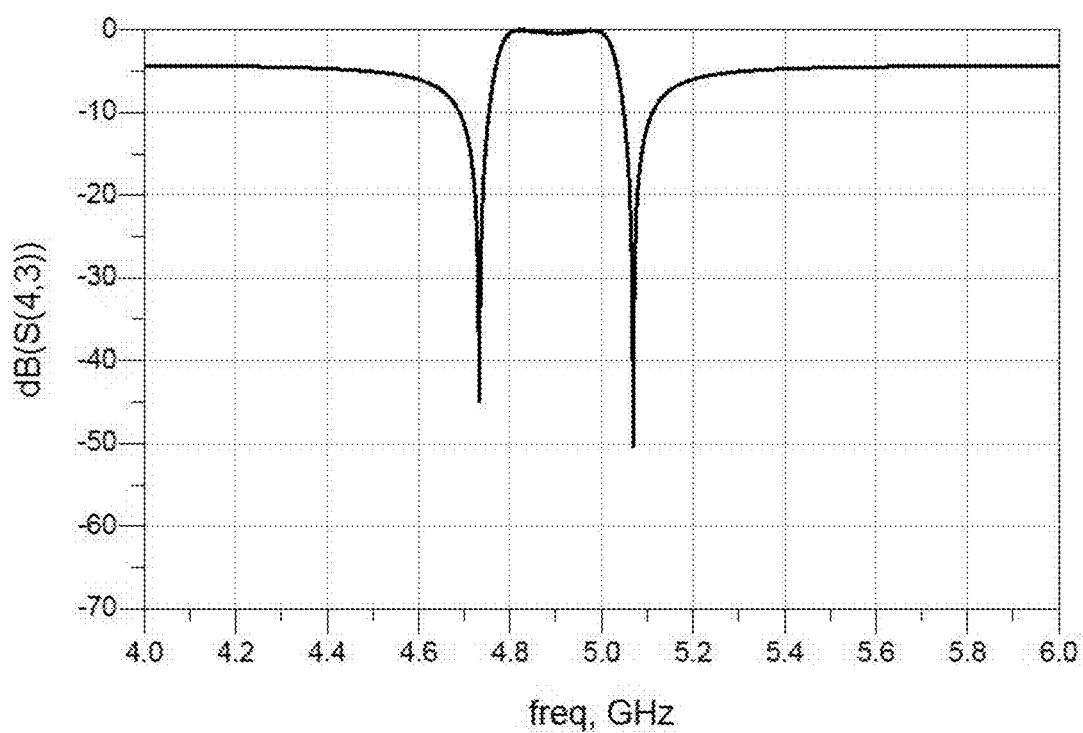
FIG. 32 is the transmission curve of two BAW resonators individually composing the filter extracted from Example 1.

Example 1 is a hybrid filter structure with two BAW resonators, six IPD inductors, and two capacitors. Example 2 will give the performance of the filter when only two BAW resonators are present. As shown in FIG. 32, which shows the transmission curves of the filter consisting of two BAW resonators alone extracted from Example 1, it can be seen from the Figure that the RF filter consisting of BAW resonators alone has a high roll-off coefficient, but there is an obvious notch in the passband. To solve the problem of passband depression, the industry often adopts the method of multi-stage cascading of BAWs, and when the number of BAWs reaches about 4 order (about 7-8 resonators), it can have a passband performance that meets the needs of the application. However, BAW filters can not be vertically multiple (more than two resonators) integration, it is usually in the same wafer for the horizontal laying of the lead connection, with the communication frequency of high frequency, if you still use this scheme, the volume is bound to get bigger and bigger, accompanied by a serious heat and power capacity overload, which will violate the original intention of the RF device of high-frequency, integration, miniaturization.

Figure 35:
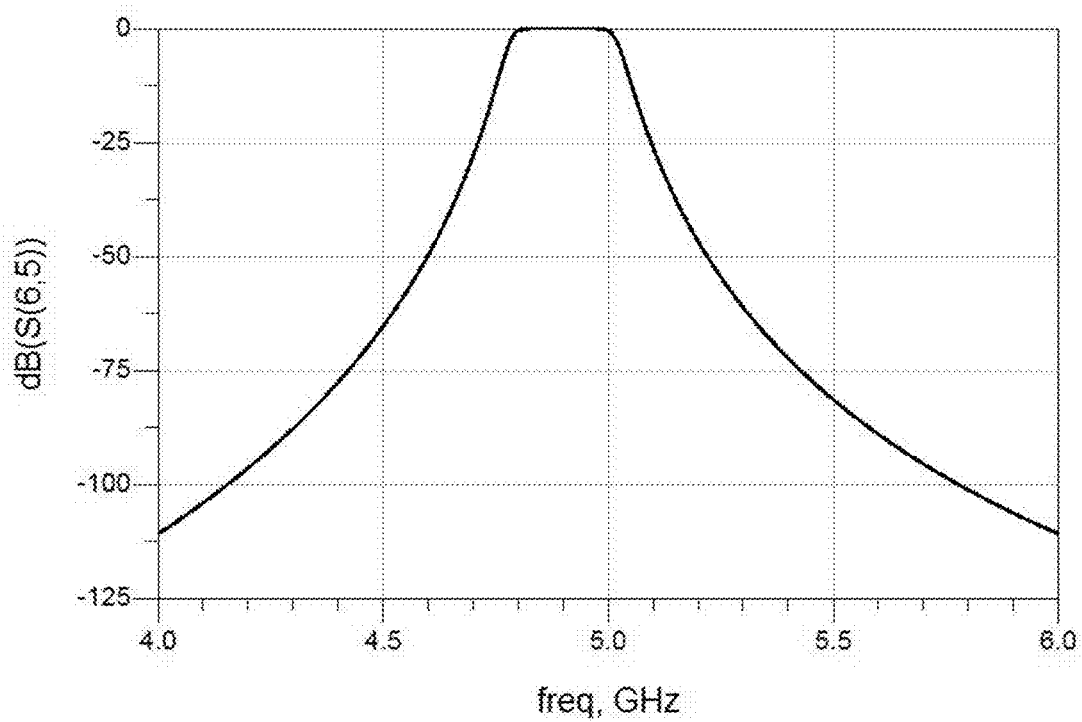
FIG. 35 is a schematic diagram of the parametric curve S21 for Example 3.

Example 3 gives the signal transmission curve of the IPD circuit (six IPD inductors and two capacitors) extracted as a separate part in Example 1. As shown in FIG. 35, the filter formed by the IPD circuit has excellent passband performance, but it is obvious that the IPD filter's roll-off performance is too slow to satisfy the more and more congested band division in the era of high frequency communication. The slow roll-off does not accurately extract the frequency bands needed at the receiver end, resulting in spectral confusion.

Therefore, this application integrates the IPD filter with the BAW filter monolithically, which is essentially to provide a relatively mature solution for high-frequency broadband of the future filter.

In the description of this specification, reference to the terms "an embodiment", "some embodiments", "examples", "specific examples", or "some examples" means that the specific features, structures, materials, or characteristics described in conjunction with the embodiment or example are included in at least one embodiment or example of the present application.", "some examples", "exemplary", "specific examples", or "some examples" means that the specific features, structures, materials, or characteristics described in connection with the embodiment or example are included in at least one embodiment or example of the present application. Moreover, the specific features, structures, materials, or characteristics described may be combined in any one or more of the embodiments or examples in a suitable manner. Moreover, without contradicting each other, those skilled in the art may combine and combine different embodiments or examples and features of different embodiments or examples described herein.

Furthermore, the terms "first" and "second" are used for descriptive purposes only and are not to be understood as indicating or implying relative importance or implicitly specifying the number of technical features indicated. Thus, a feature defined with the terms "first", "second" may expressly or impliedly include at least one such feature. In the description of this application, "more than one" means two or more, unless otherwise expressly and specifically limited.

The foregoing is only a specific embodiment of the present application, but the scope of protection of the present application is not limited thereto, and any person skilled in the art can easily think of various variations or substitutions thereof within the scope of the technology disclosed in the present application, which shall be covered by the scope of protection of the present application. Therefore, the scope of protection of this application shall be subject to the scope of protection of the claim.

The invention claimed is:

1. A method for preparing a hybrid filter on a chip with an integrated passive device (IPD) and a film bulk acoustic resonator (FBAR), comprising:
    (1) preparing a leakage isolation layer on a supporting substrate by deposition;
    (2) obtaining an inductor layer by first physical vapor deposition on the leakage isolation layer prepared in step (1), leaving a window at a bottom of a groove surrounding a cross section of a through glass via (TGV) inductor stack on a mask, and patterning an inductor metal simultaneously;
    (3) forming a first insulating layer on the inductor metal prepared in step (2) by first chemical vapor deposition, and forming lead through holes by photolithography;
    (4) repeating steps (2) and (3) alternately to obtain a three-layer stacked TGV inductor;
    (5) depositing a second insulating layer on the three-layer stacked TGV inductor prepared in step (4) by second chemical vapor deposition to serve as a partition between a capacitor layer and the three-layer stacked TGV inductor;
    (6) depositing two capacitor layers on the second insulating layer deposited in step (5) by second physical vapor deposition, and depositing a third insulating layer between the two capacitor layers to form a metal insulator metal (MIM) capacitor; and
    (7) preparing a bulk acoustic wave (BAW) resonator on the MIM capacitor prepared in step (6), and connecting the three-layer stacked TGV inductor, the MIM capacitor and the BAW resonator through the lead through holes to obtain the hybrid filter.

2. The method for preparing the hybrid filter on the chip with the IPD and the FBAR according to claim 1, wherein the BAW resonator comprises a bottom electrode, a piezoelectric layer, a top electrode and an anti-oxidation layer arranged in sequence, and an air gap is formed between the bottom electrode and the MIM capacitor.

3. The method for preparing the hybrid filter on the chip with the IPD and the FBAR according to claim 2, wherein a material of the bottom electrode and the top electrode is one or more of aluminum, molybdenum, tungsten, platinum, titanium, and gold.

4. The method for preparing the hybrid filter on the chip with the IPD and the FBAR according to claim 2, wherein a material of the piezoelectric layer is single-crystalline aluminum nitride, or polycrystalline aluminum nitride, or zinc oxide, or lead zirconate titanate, or barium strontium titanate (BST), or $LiNbO_3$.

5. The method for preparing the hybrid filter on the chip with the IPD and the FBAR according to claim 2, wherein a material of the anti-oxidation layer is aluminum nitride.

6. The method for preparing the hybrid filter on the chip with the IPD and the FBAR according to claim 1, wherein a material of the supporting substrate is silicon, sapphire, $LiGaO_2$, or metal.

7. The method for preparing the hybrid filter on the chip with the IPD and the FBAR according to claim 1, wherein a material of the leakage isolation layer is gallium arsenide.

8. The method for preparing the hybrid filter on the chip with the IPD and the FBAR according to claim 1, wherein a material of each of the first insulating layer, the second insulating layer and the third insulating layer is silicon dioxide.

9. The method for preparing the hybrid filter on the chip with the IPD and the FBAR according to claim 1, wherein a material of each of the lead through holes is gold, copper, or molybdenum.

10. The method for preparing the hybrid filter on the chip with the IPD and the FBAR according to claim 1, wherein a material of the inductor layer is copper.

11. The method for preparing the hybrid filter on the chip with the IPD and the FBAR according to claim 1, wherein a material of each of the two capacitor layers is copper.

12. The method for preparing the hybrid filter on the chip with the IPD and the FBAR according to claim 2, wherein a material of the supporting substrate is silicon, sapphire, $LiGaO_2$, or metal.

13. The method for preparing the hybrid filter on the chip with the IPD and the FBAR according to claim 3, wherein a material of the supporting substrate is silicon, sapphire, $LiGaO_2$, or metal.

14. The method for preparing the hybrid filter on the chip with the IPD and the FBAR according to claim 4, wherein a material of the supporting substrate is silicon, sapphire, $LiGaO_2$, or metal.

15. The method for preparing the hybrid filter on the chip with the IPD and the FBAR according to claim 5, wherein a material of the supporting substrate is silicon, sapphire, $LiGaO_2$, or metal.

16. The method for preparing the hybrid filter on the chip with the IPD and the FBAR according to claim 2, wherein a material of the leakage isolation layer is gallium arsenide.

17. The method for preparing the hybrid filter on the chip with the IPD and the FBAR according to claim 3, wherein a material of the leakage isolation layer is gallium arsenide.

18. The method for preparing the hybrid filter on the chip with the IPD and the FBAR according to claim 4, wherein a material of the leakage isolation layer is gallium arsenide.

* * * * *